US006650107B2

United States Patent
Bakharev

(10) Patent No.: US 6,650,107 B2
(45) Date of Patent: Nov. 18, 2003

(54) CALIBRATING SQUID CHANNELS

(75) Inventor: Alexander A. Bakharev, Niskayuna, NY (US)

(73) Assignee: Cariomag Imaging, Inc., Schenectady, NY (US)

( * ) Notice: Subject to any disclaimer, the term of this patent is extended or adjusted under 35 U.S.C. 154(b) by 0 days.

(21) Appl. No.: 10/375,937

(22) Filed: Feb. 25, 2003

(65) Prior Publication Data

US 2003/0146746 A1 Aug. 7, 2003

Related U.S. Application Data

(63) Continuation of application No. PCT/US01/26305, filed on Aug. 23, 2001.

(51) Int. Cl.[7] .................. G01R 35/00; G01R 33/035
(52) U.S. Cl. ....................................... 324/202; 324/248
(58) Field of Search ................................. 324/202, 248, 324/244, 260, 261; 505/845, 846, 705

(56) References Cited

U.S. PATENT DOCUMENTS

| 4,851,776 A | 7/1989 | Goto et al. |
| 4,983,912 A | 1/1991 | Roehrlein et al. |
| 5,854,492 A | 12/1998 | Chinone et al. |
| 6,084,399 A | 7/2000 | Nagaishi et al. |

*Primary Examiner*—Jay Patidar
(74) *Attorney, Agent, or Firm*—Katten Muchin Zavis Rosenman

(57) ABSTRACT

Improved calibrations associated with superconducting quantum interference devices (SQUIDs) are accomplished using a single calibration ring that is placed on an outer dewar wall. During initial calibration, a standard current is passed through the calibration ring and channel responses are measured and recorded. During re-calibration, any channel responses that have changed from the original value U to a new value U', are identified and the corresponding empirical coefficients for these channels are changed from an old value of C to a new value C' given by:

$$C' = (U'/U)C$$

Channel responses in subsequent measurements are divided by these coefficients C' in order to make them equal for equal magnetic field inputs, or to provide equal channel sensitivities.

11 Claims, 5 Drawing Sheets

CALIBRATING SQUID CHANNELS

This application is a continuation of international application number PCT US01/26305, filed on Aug. 23, 2001 (status, abandoned, pending, etc.).

BACKGROUND OF THE INVENTION

1. Field of Invention

The present invention relates generally to the field of measuring magnetic fields. More specifically, the present invention is related to calibrating superconducting quantum interference device (SQUID) channels that are used in measuring magnetic fields.

2. Discussion of Prior Art

A SQUID magnetic sensor is at the heart of a sensitive magnetometer aimed at measuring magnetic fields below approximately $10^{-10}$ Tesla (T). This is the range of magnetic fields produced by living organisms (also called biomagnetic fields). For example, the human heart produces fields between $10^{-12}$ T and $10^{-10}$ T just outside of a chest surface. The magnetic fields emanated from the human brain, just outside of the head, are of the order of $10^{-14}$ T–$10^{-12}$ T. These numbers can be compared with the earth's magnetic field of about $10^{-4}$ T and the typical urban magnetic noise of $10^{-8}$ T–$10^{-6}$ T.

SQUIDs react to a magnetic flux rather than a field. Magnetic flux $\Phi_B$ is defined as the projection of the average magnetic field threading a given area along the area's normal z, times that area A, or mathematically:

$$\Phi_B = B_z A$$

A low-Tc dc SQUID is an ultra-sensitive, low-noise transducer of magnetic flux $\Phi_B$- to voltage, consisting of two nominally identical superconducting elements called Josephson junctions serially connected in a superconducting, electrically continuous loop. The SQUID loop is quite small in dimensions, typically $10^{-4}$–$10^{-2}$ mm². Today SQUIDs are typically produced on a chip, using Nb—Al junction technology, with junctions and the SQUID loop made of thin films. The micron-scale dimensions of the layout are defined using photolithographic techniques. The SQUID chip is typically enclosed in a superconducting shield screening the device from ambient magnetic flux. The magnetic flux to be measured is typically intercepted by considerably larger, 10–20 mm diameter loops or coils (called pick-up or detection coils) inductively coupled to a SQUID via an input coil. These coils are usually made of thin insulated superconducting (Niobium) wire wound over some non-conducting cylindrical support, although in some instances they are integrated on a chip with a SQUID. A single coil or a single loop intercepting magnetic field is called a magnetometer. More complex combinations of coils or loops, described in more detail below, form a gradiometer.

Since the SQUID and the coils must be kept in a superconducting state, they are immersed in liquid helium at temperatures only a few degrees above absolute zero (about $-460°$ F., or $-269°$ C., or $4°$ K.). The double-wall vessel (space between walls being evacuated) intended for keeping and thermally isolating liquid helium is called a dewar. Dewars, in biomagnetic applications, are made largely of fiberglass in order to minimize magnetic interference with SQUIDs. Indeed, even non-magnetic metals are sources of secondary magnetic fields resulting from induced eddy currents.

Magnetocardiography (MCG) systems usually employ an array of sensors, for example 7 to 40. Measuring channel usually refers to one member of such an array, which comprises a single SQUID sensor inductively coupled to an arrangement of detection coils (magnetometer or gradiometer). Both SQUID and detection coils are typically mounted on a fiberglass support rod or on a fiberglass narrow, hollow cylinder. Shielded SQUID with its gradiometer together is usually called a sensor. The electrical leads or interconnects connect the sensor to associated electronic units stationed outside of a dewar at room temperature. Part of a channel that is physically attached to a fiberglass rod or a cylinder is called a probe. Additionally, the probes are essentially modular, so that each probe can be removed and inserted back into the dewar as necessary. Alternatively, all SQUID channels may be connected together in a common (non-modular) structure.

A response of a SQUID channel to a given input can be defined as a ratio of the output voltage to a combination of magnetic fields $B = \Phi_B/A$ found at the detector coils. The form of this combination depends on a gradiometer type. For example, FIG. 1 illustrates a $2^{nd}$ order symmetrical axial gradiometer consisting of three flat, axial, nominally identical coils or loops wound together. The loops contain 1-2-1 turns in the simplest implementation.

Because of the way the coils are wound, the supercurrents induced in the central loops flow in the direction opposite to the supercurrents in the two outer loops, so that the two outer coils produce signals of opposite polarity to the inner two-turn coil. Thus, this gradiometer produces a signal proportional to:

$$S_2 = B_z(z_0) - 2B_z(z_0+l) + B_z(z_0+2l)$$

where $B_z(z)$ is the z-component of magnetic field at a coordinate z, $z_0$ is the coordinate of a lower detection coil, and l is the distance between neighboring coils called gradiometer's base line, or base. In order to optimize signal-to-noise ratio (SNR), the base is chosen to be approximately equal to half of the distance from the lower detection coil to the magnetic field source (e.g., the heart). In gradiometers designed for heart measurements l is typically chosen to be about 5 cm, because the distance between the lower coil, placed about 2–3 cm above patient's chest, and the heart is approximately 10 cm in a typical adult.

Similarly, one can wind a $3^{rd}$ order gradiometer, which would consist in the simplest implementation of 1-2-2-1 loops, and so on, for even higher orders (see for example A. I. Braginski, H. J. Krause, and J. Vrba, in Handbook of Thin Film Devices, edited by M. H. Francombe, v. 3: Superconducting Film Devices, Chapter 6, p. 149, Academic Press (2000), incorporated here as a reference).

A gradiometer of k's order acts almost as a magnetometer for nearby sources, while it subtracts spatially-constant magnetic field $B_z$ and spatial derivatives up to order (k-1): $dB_z/dz$, $dB^2_z/dz^2$, etc. for distant sources. For example, a $2^{nd}$ order gradiometer subtracts B and $dB_z/dz$ for distant sources. Thus, in this case the output voltage V divided by $S_2$ can be considered to be the absolute channel response, in units of Volts/Tesla.

The output voltage V is the result of all electromagnetic processes taking place in the numerous electrical components of a given channel, including induced currents in the detector coils, induction coupling between the input coil and the SQUID, voltage response of a SQUID, filtering and electronic amplification of a signal, etc. Thus, the total channel response mixes SQUID's transfer function with properties of the detection coils as well as with characteristics and settings of the associated SQUID electronics.

In order to determine absolute channel response V/S, one would need to know absolute values of the magnetic field at the positions of gradiometer detection coils. While this can be done, either by an actual measurement or by a calculation for a known field source, for the purposes of the specification, it is sufficient to find channel voltage response V alone, without dividing it by the magnetic signal S, as long as the field source is the same every time V is measured, as will be explained in more detail below. In what follows this voltage V is called the channel response.

As is clear, despite all possible precautions, nominally identical but physically different channels will inevitably present a certain spread of parameters. A number of factors contribute to channel-to-channel differences in the output response. Among these are geometrical and electronic factors.

Geometric factors are easily controlled. In the modular configuration, each probe is inserted into a specially designed space (notch) inside a dewar, so that its position and all the distances with respect to dewar's overall geometrical shape (shell) and to the other probes are fixed and reproduced as well as mechanically possible; with proper care (such as making sure that there is no frozen air at the bottom of the notch) the reproducibility of a geometrical probe configuration is sufficiently good. This is even more so in the monolithic, non-modular system where all probes are rigidly connected together.

Electronic factors tend to have considerably more variation from channel to channel, and also as a function of time and system's use. SQUID sensors may have different inductive couplings to their respective detector coils (gradiometers), and SQUIDs themselves may exhibit variability in their characteristics. Furthermore, the SQUID output signal is electronically amplified thousands of times. The multi-stage amplification with somewhat varying amplification coefficients produces a spread of the outputs, despite equal inputs.

Thus, for proper operation of an MCG system, different SQUID channels have to be calibrated in terms of their responses, to make them equal for equal input magnetic fields. To do that, one traditionally provides an arrangement in which each channel is exposed to a significantly non-uniform, nominally identical magnetic field, wherein the field source is preferably similar in its general type and distance from the sensor to the real source of interest (such as heart). Then, one measures channel voltage responses to this field. Inevitable differences in response will be found, for reasons outlined above. The system operator can then determine empirical ratios of channel responses, thus defining corresponding empirical coefficients for each channel with respect to one channel chosen as a reference. For example, the least sensitive (smallest response) channel number n is taken as such a reference, with its corresponding coefficient $C_n$ taken to be unity, $C_n=1$. Any other channel, for example channel m, produces voltage response $V_m$ such that $V_m > V_n$, with corresponding coefficient $C_m = V_m/V_n > 1$, where m is any channel index other then the index of the least sensitive channel n. In this case, division of the channel response voltages by corresponding coefficients, $V_m/C_m = V_n$ makes the channel responses equal to the reference response of the least sensitive channel and to each other for equal fields at the detector coils. The result of this calibration can be also characterized as achieving equal sensitivity in system's channels.

Once determined, these coefficients are introduced into the data-acquisition software; alternatively, amplification coefficients of each channel's electronics may be adjusted by the factors $C_m$ to achieve the same result.

As will be evident to the one skilled in the art, one can alternatively choose any channel—not necessarily the least sensitive one—as a reference channel. In general then some coefficients C will be greater than unity, while others will be smaller than unity. The chosen (reference) channel has coefficient equal to unity.

The method for finding these numerical coefficients (for initial system calibration purposes) in prior art systems consists of placing a standard circular current loop (or, alternatively, a matrix of such identical loops, which would be fed with identical currents one by one) under the dewar's bottom, directly under each gradiometer's lower detection coil. Additional care is taken to precisely position the dewar, with probes inside, over this field-producing loop or a matrix of loops, as shown in FIG. 2. FIG. 2 illustrates a dewar with an outer wall and an inner wall which enclose the probes 201 containing SQUID sensors (not shown) and gradiometer coils 202.

The current loop 203 is about the size of a gradiometer coil, i.e., about 20 mm in diameter. The standard current is supplied to the loop 203 from a calibrated current source 204, and the loop 203 is placed as precisely as possible under different probes 201, at a distance of about 10 cm from the lower detection coil, to mimic the heart's field.

It should be noted that the vector of the dipole moment of such an xy-plane loop lies in z-direction, being perpendicular to the dewar's bottom, while the dipole vector of a real heart lies typically in the xy-plane; in other words, the real heart looks more like a vertical rather than a horizontal loop. The loop 203 may be placed in the vertical (xz or yz) plane to better mimic the heart's field configuration. This does not make too much of a difference for the purposes of the calibration procedure.

Next, the channel responses to nominally identical magnetic inputs induced by the loop 203 fed with standard current, said loop 203 placed in turn under each channel, are measured. Then, coefficients are calculated as explained above and, using these empirical coefficients, channel responses are equalized either through software or through hardware (electronics) adjustment.

This calibration method is somewhat cumbersome procedure, and it has its own sources of error, such as a problem of precise positioning of the current loop exactly under the respective gradiometers. This procedure is best done by the system manufacturer, in a shop equipped with means for precisely placing the loop and/or precise dewar positioning over it. Additionally, it is best performed in the absence of strong magnetic and RF interference, which can be achieved by having some magnetic shielding around the system, or by placing a system in a low magnetic interference environment. Such conditions may be hard to realize at the customer's location, and they are generally best achieved in a specialized manufacturer's shop.

Thus, one would ideally prefer to perform said calibration only once, in controlled environment. However, the problem is that a calibration will change in the course of time, as a result of any system modification or adjustment, and in particular as a result of any changes in electronics. Therefore, the calibration procedure is preferably repeated in prior art systems every time the system is moved, repaired, or an electronic part is replaced. These repeated, subsequent calibrations are typically performed by the customer under non-ideal conditions. This burdens the customer, and makes calibrations unreliable.

Whatever the precise merits, features and advantages of the above cited prior art systems, none of them achieve or fulfills the purposes of the present invention to provide an easy-to-use and accurate method and system of calibrating SQUID channels.

SUMMARY OF THE INVENTION

The present invention provides for a system and method for the improved calibration of magnetic field sensors based on superconducting quantum interference devices (SQUIDs). The improved calibration arrangement consists of a single fixed calibration ring encompassing all measuring channels, which is placed on an outer dewar wall, preferably near the middle of the gradiometer by height (i.e. approximately at the level of the middle set of gradiometer coils, or at a distance equal to one gradiometer base 1 above the level of the lower detection coils). During initial factory calibration, in addition to the small-loop procedure outlined above, either immediately subsequent to this procedure, or immediately preceding this procedure, a standard current is passed through the large calibration loop or ring, and channel responses U are measured and recorded. During re-calibration, the same standard current is passed through the ring, thus providing for the same magnetic field distribution over the gradiometer coils. Any channel responses that have changed from the original value U to a new value U', are identified and the corresponding empirical coefficients for these channels are changed from an old value of C to a new value C' given by:

$$C'=(U'/U)C$$

These new coefficients C' are then used to equalize channel responses as described above. To put it differently, they provide for equal sensitivity of different channels, which is the goal of the calibration procedure.

The system and method of the present invention are used to calibrate medical equipment utilizing SQUIDs used in the measure of magnetic fields associated with the heart.

DESCRIPTION OF THE PREFERRED EMBODIMENTS

Figure 1:
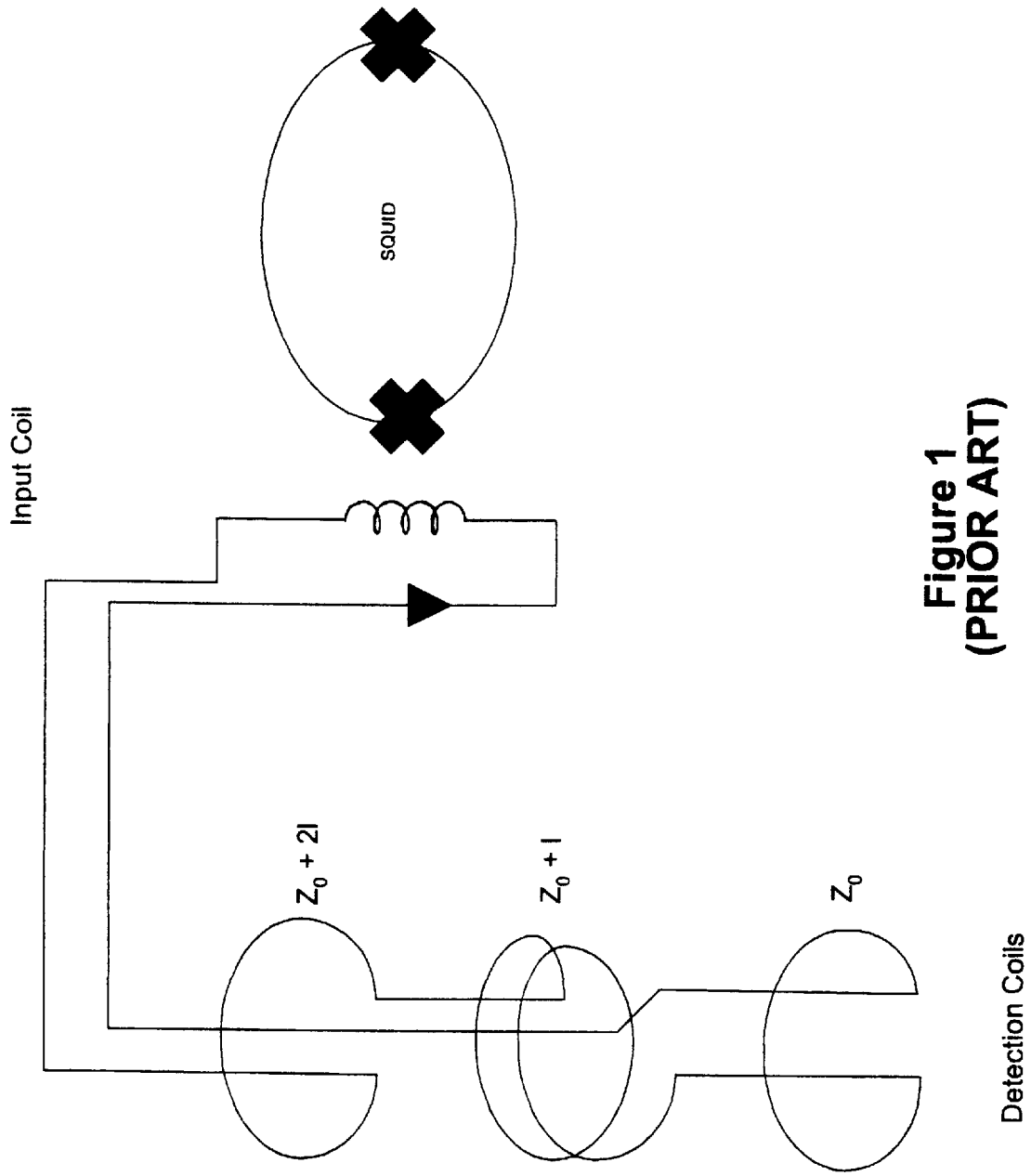
FIG. 1 illustrates a $2^{nd}$ order axial gradiometer consisting of three (1-2-1 turns in the simplest implementation) flat, axial, nominally identical coils wound together.

While this invention is illustrated and described in a preferred embodiment, the invention may be produced in many different configurations, forms and materials. There is depicted in the drawings, and will herein be described in detail, a preferred embodiment of the invention, with the understanding that the present disclosure is to be considered as an exemplification of the principles of the invention and the associated functional specifications for its construction and is not intended to limit the invention to the embodiment illustrated. Those skilled in the art will envision many other possible variations within the scope of the present invention.

The system and method of the present invention addresses a need to improve SQUID channel calibrations performed by the customer, making them simple, precise, reliable, fast and automatic.

Figure 3A:
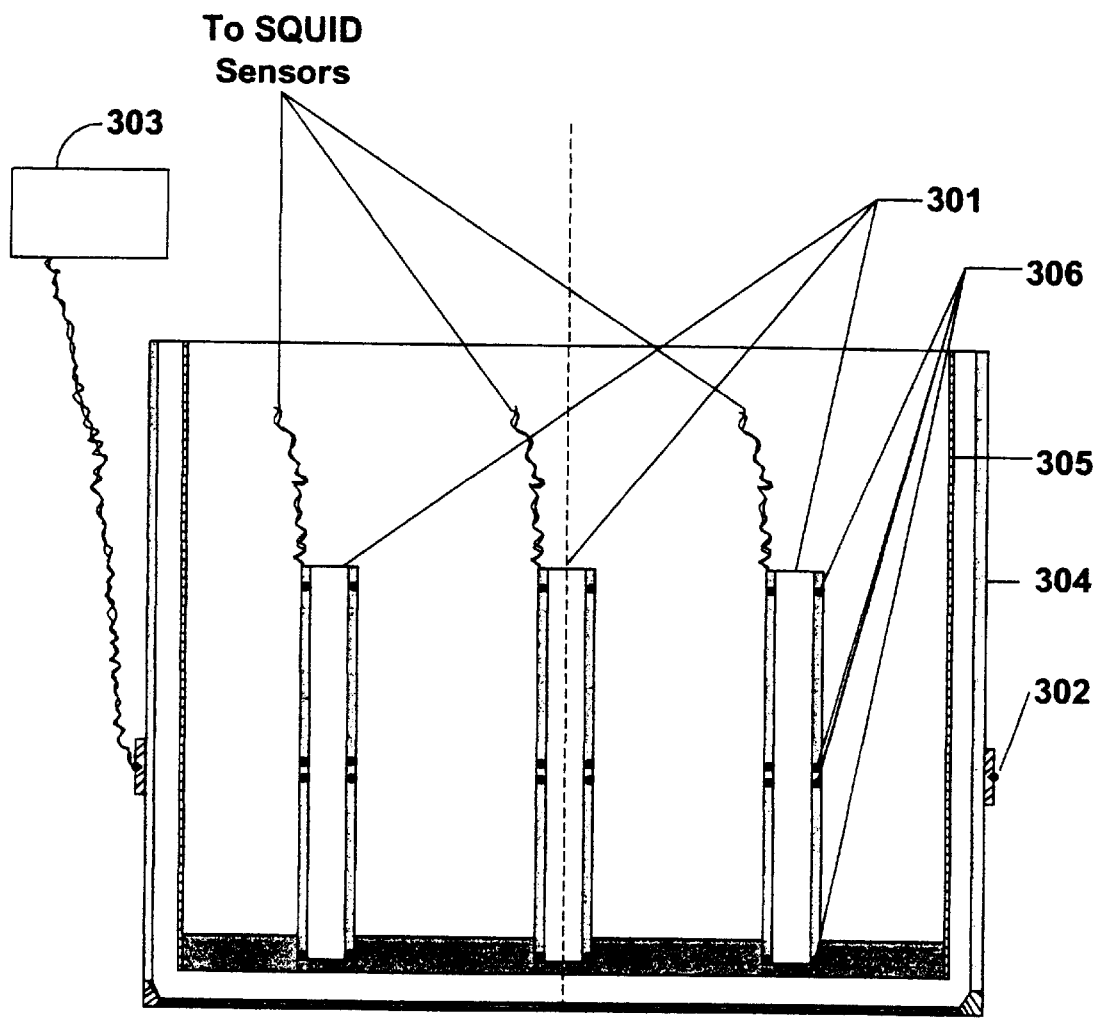
FIGS. 3a and 3b collectively illustrate the present invention's system for maintaining the calibration of SQUID channels.
Figure 3B:
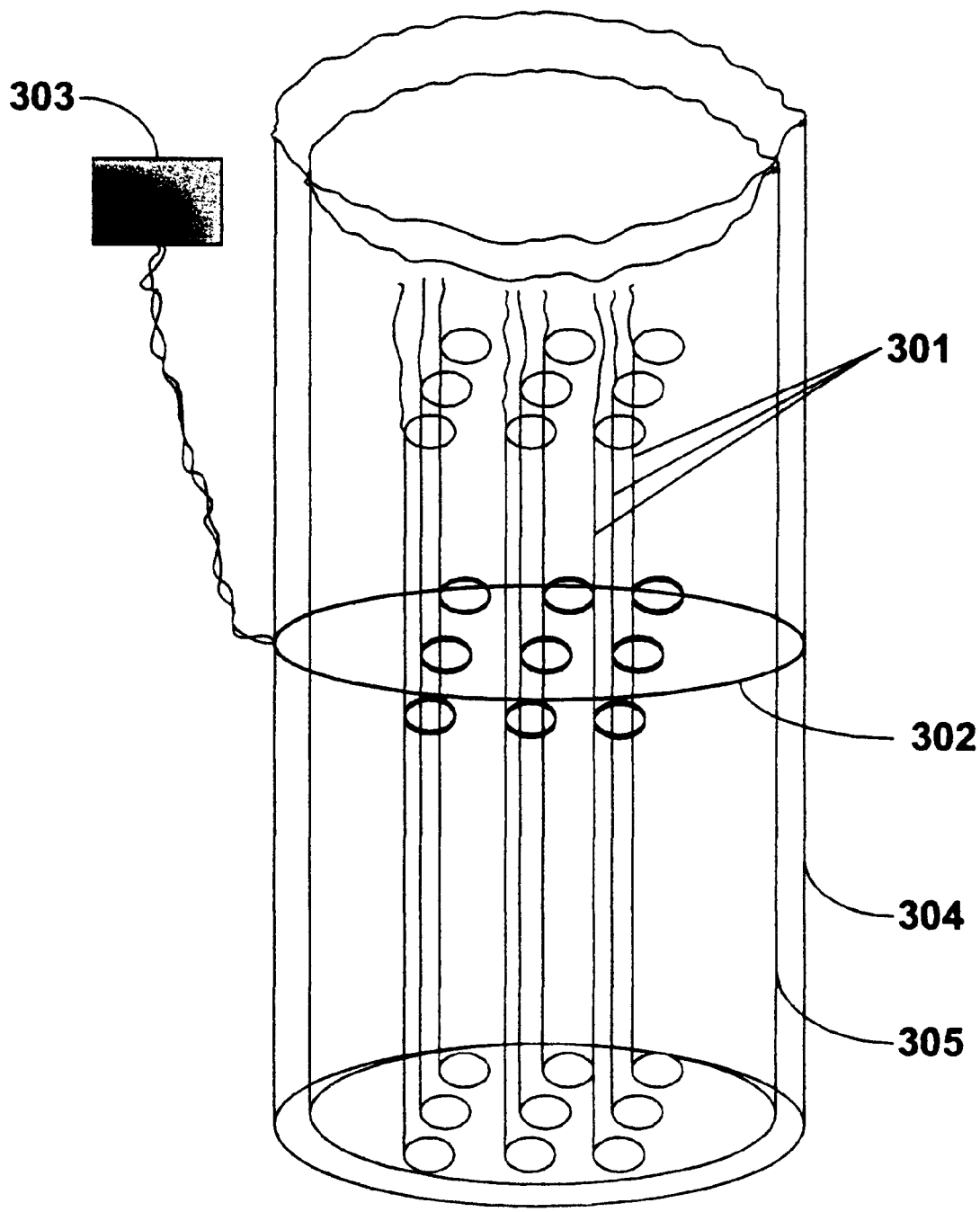

FIGS. 3a and 3b collectively illustrate the system of the present invention for calibrating SQUID channels. FIG. 3a illustrates a sectional view of the system of the present invention. FIG. 3b illustrates a three dimensional view of the system of the present invention. According to the present invention, a dewar (shown as having an inner wall 305 and an outer wall 304) enclosing one or more probes 301 is equipped with the permanent circular wire loop or ring at the circumference of the dewar's outer wall 304 (calibration ring 302), preferably at or near the plane of middle gradiometer detection coils 306. It should be noted that although only one set of gradiometer coils are numbered in the Figure, each of the probes have a similar number of gradiometer coils (as shown). The calibration ring is on the outside of a dewar at room temperature (and therefore the material of the ring is in a normal, non-superconducting state at all times, independent whether it is made of a superconducting metal or not). In the preferred embodiment, this ring is placed under tension around dewar's outer wall, in a pre-machined groove so that it has constant circular shape. One can note, however, that it is possible to arrange to have this ring fixed on the dewar's inside housing as well. The ring is not a complete circle: it is by itself disconnected, and its ends are electrically connected to a calibrated constant current source 303 via a twisted pair of wires. Unless used in a calibration, the ring is normally electrically disconnected, so it does not contribute greatly to the dewar's magnetic noise (since closed loops may have induced parasitic currents which contribute to magnetic noise). In addition, the ring's wire is preferably made of any non-magnetic metal, preferably of relatively high resistivity (for example Nb with its resistivity of about 15 $\mu\Omega$cm (micro-ohm-centimeter) at room temperature, or even higher resistivity metals or metal alloys, such as for example Nb—Ti alloy), in order to reduce RF interference from the ring acting as an antenna. When a calibration is desired, the ring is closed via a current source, and a predetermined current is passed through it. Again, in a way of possible alternatives, it should be noted that while a constant DC current passing through the ring, one skilled in the art can envision alternating, AC current being fed to the ring, as long as this current is well-specified and standard (e.g. of standard amplitude and frequency).

Figure 2:
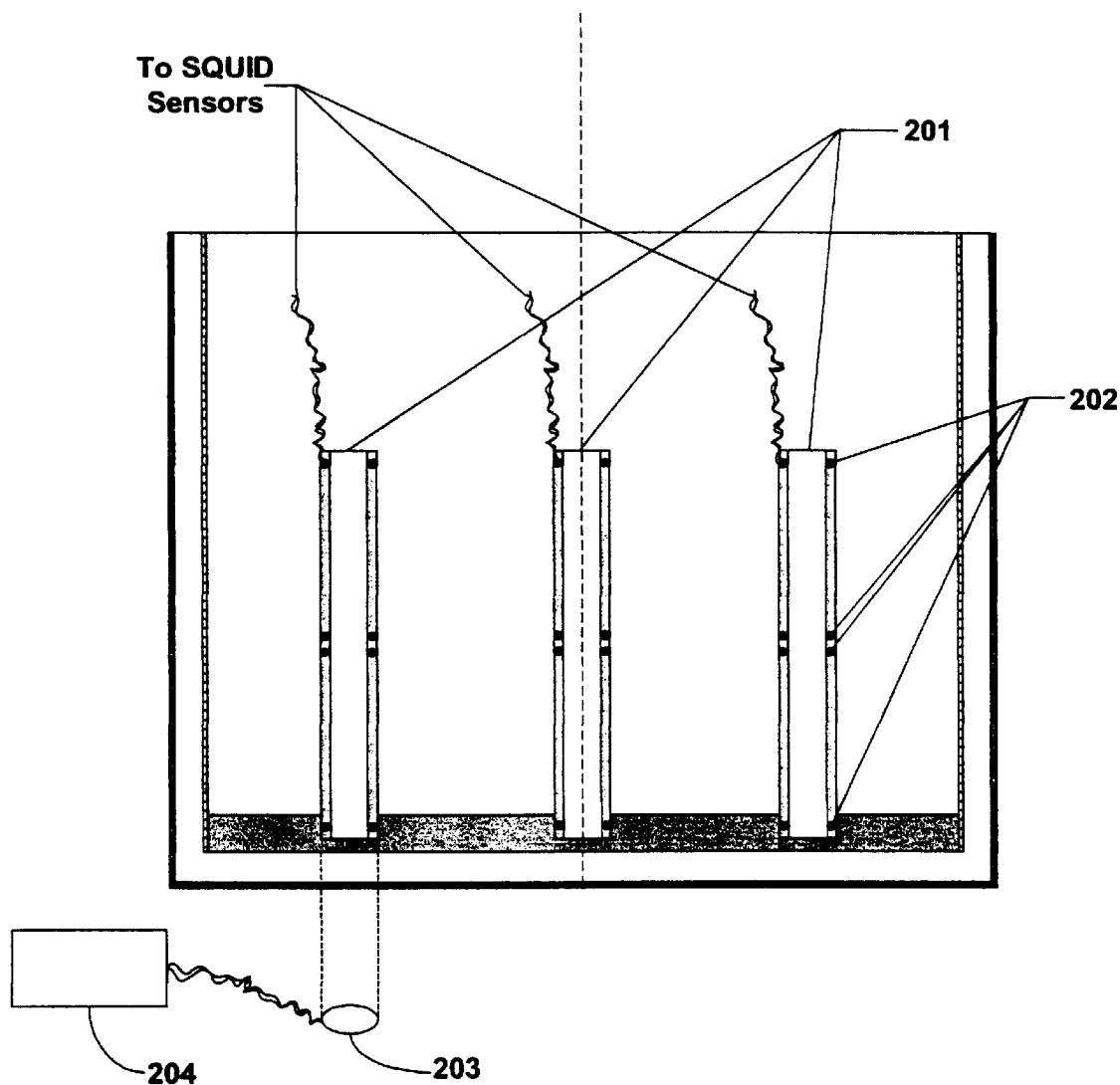
FIG. 2 illustrates a prior art calibrating system.

In the initial (factory) system calibration, in addition to measuring channel responses to the small current loop input, said current loop placed under each channel as described above, the manufacturer passes a standard current (not necessarily the same) through the calibration ring 302 and performs additional measurements of channel responses U to the magnetic field of the calibration ring 302 (the letter V is used to denote responses from the small loop 202 and letter U to denote responses from the large ring 302). Channel responses to the excitation from small current loop 202 placed under each channel, as well as the responses from the big calibration ring 302 are recorded for each channel, producing sets of $V_m$ and $U_m$ values, where index m runs over all channel numbers, m=1, 2, . . . , N, where N is the total number of channels in the system; for example, in a 9-channel system m=1, 2, . . . ,9. These responses $U_m$ will now serve to re-calibrate the system on all future occasions. It should be noted that the calibrating system to described in FIG. 2 can also be used in the present invention, during the initial factory calibration.

Specifically, when a re-calibration is desired, one passes the same standard current through the calibration ring 302, and measures channel responses. If a response of channel m changed from the original factory-calibration value $U_m$ to a new value $U'_m$, the corresponding empirical coefficient for this channel changes from the old value $C_m$ to a new value $C'_m$ given by:

$$C'_m=(U'_m/U_m)C_m$$

These empirical coefficients $C'_m$ are then either introduced into the appropriate software, or the electronic amplification of each channel is adjusted (reduced by $C'_m$) so that channel m would show an output equal to the original factory output $U_m$; in other words, the system should perform a division of $U'_m$ by $C'_m$, giving adjusted (re-calibrated) outputs $U_m = U'_m / C'_m$, for m=1, 2, ..., N. As it is clear from what was said above, this procedure will simultaneously lead to equalization of all channel responses to equal inputs. In other words, if a proper small loop 202 calibration would have been performed now with new coefficients C' determined through the use of the large ring 303, channel responses would have become all equal to $V_n$.

It should be noted that this procedure does not require the calibration ring or its field to be of a perfect shape, or perfectly symmetrical with respect to the probes, or to be exactly at the level of the middle gradiometer coils. All that is required is that the ring and the current in it are the same as in the original factory calibration and remain the same every time a re-calibration is performed. Further note that unlike the nominally-identical inputs from the small current loop 202, the magnetic field distribution resulting from the current in ring 302 is necessarily non-uniform over any horizontal plane containing gradiometer detection coils. Thus, for different channels these responses U will be substantially different even if the channels themselves were identical (except possibly for symmetrically positioned channels). However, these differences do not in any way preclude performing subsequent re-calibrations as explained above.

As is clear to those skilled in the art, the described ring calibration procedure can be easily automated, making the system perform such calibrations often, and without user involvement. This results in improved system performance both technically and in terms of customer comfort. This ring calibration will be especially beneficial for larger systems, such as for the 36–40 channel systems.

Figure 4:
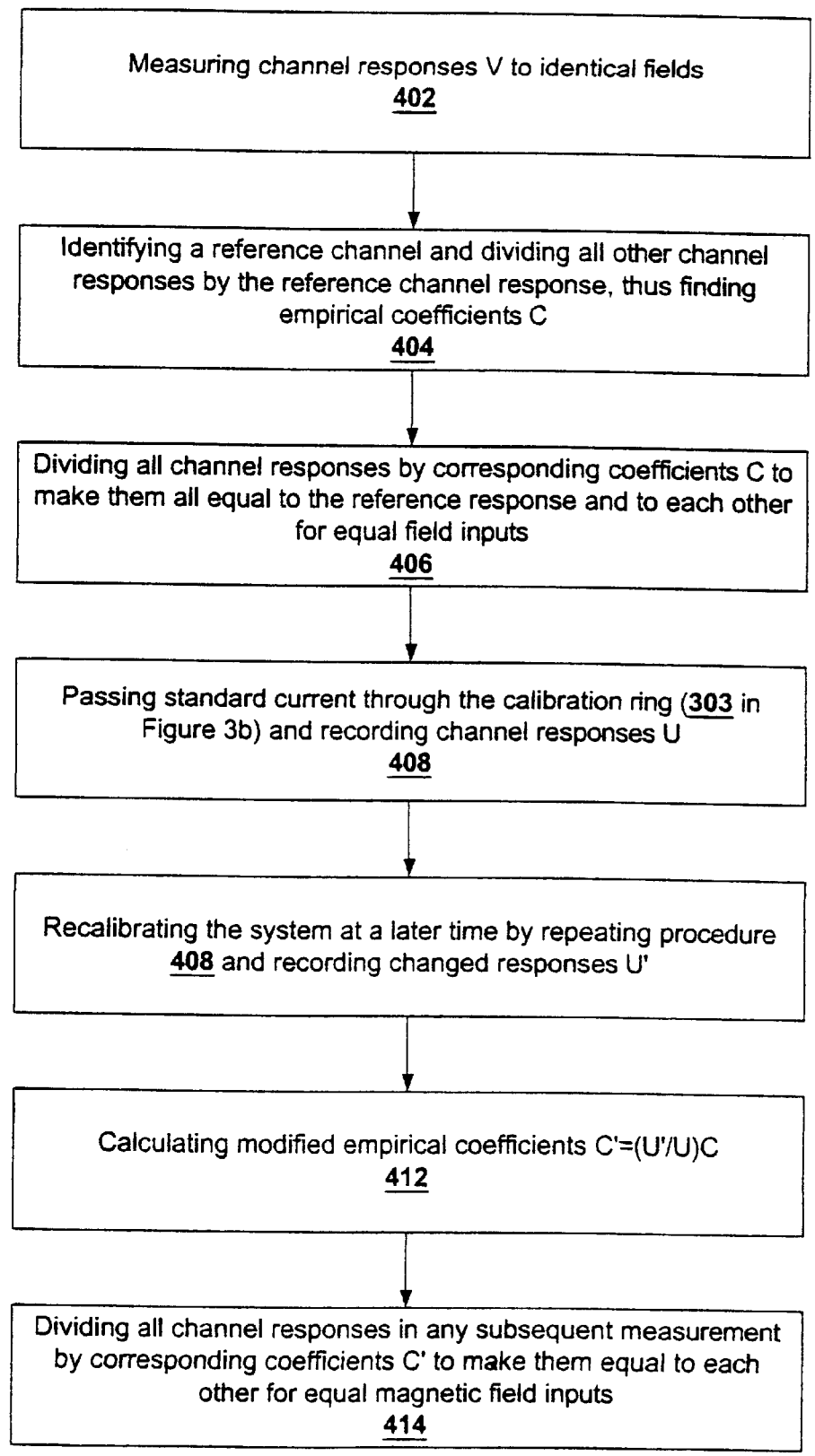
FIG. 4 illustrates a flow chart depicting a preferred embodiment of the present invention's method for calibrating SQUID channels.

FIG. 4 illustrates a flowchart of the preferred embodiment of the present invention's method 400 for calibrating superconducting quantum interference device (SQUID) channels, wherein the channels include one or more gradiometer detection coils located inside a dewar.

First, standard magnetic field source based upon a fixed current in the precisely-positioned current loop 302 (FIG. 3a) is placed under each channel, and channel response voltages V are measured and recorded, preferably in the controlled factory settings 402.

Next, a reference channel, for example, a channel with the lowest response V, is chosen and all channel responses are divided by this reference response to obtain channel empirical coefficients C, which are introduced into the appropriate software, 404.

Next, all channel responses are divided by corresponding coefficients C to make them all equal to the reference response and to each other for equal inputs, 406.

Next, in the same controlled factory setting, at the time of this initial calibration, a fixed current is passed through the large calibration ring (303 in FIG. 3b) and channel responses U to this magnetic field source are measured and recorded, 408. This ends initial factory calibration.

Next, whenever a re-calibration is desired at a later time, in customer's settings, procedure 408 is repeated with the same fixed current in the calibration ring, and new (generally, changed for a variety of reasons) responses U' are measured and recorded, 410.

Next, new empirical coefficients are calculated and introduced into the appropriate software, according to C'=(U'/U)C, where C are old channel coefficients, 412.

Next, following this re-calibration, all channel responses that may be subsequently measured in the normal course of using the system (for example, when it is used in magnetocardiography) are divided by corresponding new channel coefficients C' to make them all equal for equal inputs, 414, or to make them equally sensitive.

Thus, the present invention provides for an improved SQUID channel calibration system and method that is simple, precise, reliable, fast, and can be automated.

Conclusion

A system and method has been shown in the above embodiment for the effective implementation of a way of calibrating SQUID channels. While a preferred embodiment has been shown and described, it will be understood that there is no intent to limit the invention by such disclosure, but rather, it is intended to cover all modifications and alternate constructions falling within the spirit and scope of the invention, as defined in the appended claims. The programming of the present invention may be implemented by one of skill in the art of device calibration programming.

What is claimed is:

1. A system for calibrating magnetic field measuring devices, comprising:
   (a) one or more superconducting quantum interference device (SQUID) channels, said SQUID channels utilized in measuring magnetic fields, comprising SQUIDs, input coils, gradiometers with one or more detection coils, interconnects, SQUID electronics, means of measuring voltage outputs, each channel having its unique voltage response to a combination of magnetic fields at the locations of its gradiometer coils, said response subject to various factors including parameters and settings of channel electronics,
   (b) a dewar housing comprising an outer and inner wall, said gradiometer detection coils located within an area formed by the interior of said inner wall;
   (c) a calibration ring fixed on said dewar housing, said ring connected to a calibrated current source providing standard calibration current through the ring, said current in the ring producing a magnetic field detected by said gradiometer detection coils,
said system being initially calibrated and programmed to provide equal channel responses to equal magnetic field inputs sensed by its channels, with channel voltage responses U to the magnetic field generated by a fixed current in the calibration ring being recorded at the time of initial system calibration, said responses being used in re-calibrating said channels at a later time by the procedure in which said standard current is passed through said calibration ring and new responses U' are recorded, and all channel responses are then divided by the ratio of new response to the old response, U'/U, to make them equal for equal field inputs.

2. A system for calibrating magnetic field measuring devices, as per claim 1, in which the calibration ring is fixed on said outer wall of said dewar housing.

3. A system for calibrating magnetic field measuring devices, as per claim 2, in which the calibration ring is round, horizontal and fixed at or near the middle part of the gradiometer.

4. A system for calibrating magnetic field measuring devices, as per claim 1, wherein said current calibration ring is placed in a pre-machined horizontal circular groove to maintain a constant circular shape.

5. A system for calibrating magnetic field measuring devices, as per claim 3 wherein said current calibration ring is placed in a pre-machined groove to maintain a constant circular shape.

6. A system for calibrating magnetic field measuring devices, as per claim 1, wherein said current calibration ring substantially comprises of a non-magnetic material to reduce magnetic interference.

7. A system for calibrating magnetic field measuring devices, as per claim 6, wherein said non-magnetic material is Nb or Ta, or Ti, or alloys thereof.

8. A system for calibrating magnetic field measuring devices, as per claim 1, wherein said calibration current ring is connected to said calibrated current source via electrical conductors and said ring remains electrically disconnected unless used for calibration purposes.

9. A system for calibrating magnetic field measuring devices, as per claim 1, wherein said method is used in conjunction with a recording of a magnetocardiogram.

10. A system for calibrating magnetic field measuring devices, as per claim 1, wherein said SQUID channels are part of a magnetocardiography system.

11. A method of calibrating a plurality of superconducting quantum interference device (SQUID) channels, said channels comprising one or more gradiometer detection coils located inside a dewar, said method comprising the steps of:

(a) supplying a standard current to a calibration loop fixed to said dewar, and located at or near the vertical middle of the said plurality of detection coils;

(b) measuring channel response values (U') for each of said plurality of SQUID channels;

(c) identifying a new empirical coefficient value C' for each of said channels as per
C'=(U'/U)C, where C are old empirical coefficients, and (d) re-calibrating said SQUID channels with said new empirical coefficients C', by dividing measured channel responses by said coefficients, to make them have equal responses for equal input magnetic fields.

* * * * *

UNITED STATES PATENT AND TRADEMARK OFFICE
CERTIFICATE OF CORRECTION

PATENT NO. : 6,650,107 B2
DATED : November 18, 2003
INVENTOR(S) : Alexander A. Bakharev It is certified that error appears in the above-identified patent and that said Letters Patent is hereby corrected as shown below:

<u>Title page,</u>
Item [73], Assignee, should read:
-- CardioMag Imaging, Inc. --

Signed and Sealed this

Third Day of February, 2004

JON W. DUDAS
*Acting Director of the United States Patent and Trademark Office*